United States Patent
Riedewald

(10) Patent No.: US 10,953,444 B2
(45) Date of Patent: *Mar. 23, 2021

(54) PROCESS FOR THE RECYCLING OF WASTE BATTERIES AND WASTE PRINTED CIRCUIT BOARDS IN MOLTEN SALTS OR MOLTEN METALS

(71) Applicant: Frank Riedewald, Cork (IE)

(72) Inventor: Frank Riedewald, Cork (IE)

( * ) Notice: Subject to any disclaimer, the term of this patent is extended or adjusted under 35 U.S.C. 154(b) by 286 days.

This patent is subject to a terminal disclaimer.

(21) Appl. No.: 14/784,075

(22) PCT Filed: Apr. 14, 2014

(86) PCT No.: PCT/EP2014/057536
§ 371 (c)(1),
(2) Date: Oct. 13, 2015

(87) PCT Pub. No.: WO2014/167139
PCT Pub. Date: Oct. 16, 2014

(65) Prior Publication Data
US 2016/0030987 A1 Feb. 4, 2016

(30) Foreign Application Priority Data

Apr. 12, 2013 (IE) .................................... 2013/0126
Feb. 5, 2014 (GB) .................................... 1401990

(51) Int. Cl.
*B01J 19/16* (2006.01)
*B09B 3/00* (2006.01)
(Continued)

(52) U.S. Cl.
CPC .................. *B09B 3/00* (2013.01); *B03B 5/28* (2013.01); *B03B 5/36* (2013.01); *B03B 5/44* (2013.01); *B03B 9/061* (2013.01); *C10B 49/14* (2013.01); *C10B 53/00* (2013.01); *C10B 53/07* (2013.01); *C22B 1/005* (2013.01); *C22B 7/00* (2013.01); *C22B 7/001* (2013.01); *F23G 7/003* (2013.01); *H01M 6/52* (2013.01); *H01M 10/54* (2013.01); *B03B 2009/066* (2013.01); *B03B 2009/068* (2013.01); *B09B 3/0083* (2013.01);
(Continued)

(58) Field of Classification Search
CPC .... C10G 1/10; C10G 9/00; B01J 19/16; B01J 6/008
USPC ........... 422/613, 614, 624, 150; 202/96, 105
See application file for complete search history.

(56) References Cited

U.S. PATENT DOCUMENTS 3,770,419 A 11/1973 Brown
4,925,532 A 5/1990 Meuser et al.
(Continued)

FOREIGN PATENT DOCUMENTS

EP 2255940 12/2010
JP 2003/211140 A 7/2003

*Primary Examiner* — Natalia Levkovich
(74) *Attorney, Agent, or Firm* — Cesari and McKenna, LLP

(57) ABSTRACT

Disclosed is a system and method for the recycling of waste composite feed materials such as printed circuit boards (PCBs), batteries, catalysts, plastic, plastic composites such as food packaging materials, for example Tetra Pak®, mattresses, compact disks (CDs, DVDs), automobile shredder residue (ASR), electric cable wastes, liquid display panels, mobile phones of various sizes or combinations of the above using a new pyrolysis system and method.

14 Claims, 9 Drawing Sheets

(51) Int. Cl.
*H01M 10/54* (2006.01)
*H01M 6/52* (2006.01)
*C10B 53/00* (2006.01)
*C10B 53/07* (2006.01)
*B03B 5/28* (2006.01)
*C10B 49/14* (2006.01)
*C22B 7/00* (2006.01)
*B03B 9/06* (2006.01)
*B03B 5/36* (2006.01)
*F23G 7/00* (2006.01)
*B03B 5/44* (2006.01)
*C22B 1/00* (2006.01)
*H05K 3/22* (2006.01)

(52) U.S. Cl.
CPC .......... *F23G 2900/7007* (2013.01); *F23G 2900/7011* (2013.01); *H05K 3/22* (2013.01); *H05K 2203/178* (2013.01); *Y02P 10/20* (2015.11); *Y02P 20/143* (2015.11); *Y02P 70/50* (2015.11); *Y02W 30/52* (2015.05); *Y02W 30/62* (2015.05); *Y02W 30/82* (2015.05); *Y02W 30/84* (2015.05)

(56) References Cited

U.S. PATENT DOCUMENTS 5,085,738 A * 2/1992 Harris ............... C10B 7/06
201/11
5,735,933 A * 4/1998 Yokoyama ........... C22B 5/16
429/49

* cited by examiner

PROCESS FOR THE RECYCLING OF WASTE BATTERIES AND WASTE PRINTED CIRCUIT BOARDS IN MOLTEN SALTS OR MOLTEN METALS

CROSS REFERENCE TO RELATED APPLICATIONS

This application is the National Stage of International Application No. PCT/EP2014/057536, filed on Apr. 14, 2014, which claims the benefit of Ireland Application No. 20130126, filed on Apr. 12, 2013 and United Kingdom Application No. 1401990.5, filed on Feb. 5, 2014. The contents of all prior applications are hereby incorporated by reference in their entirety.

FIELD

The invention relates to a system and process for recycling of chemical compounds from waste batteries and waste printed circuit boards and the like.

BACKGROUND

In 2009, about 5 billion portable batteries (excluding lead-acid batteries) were sold in Europe. Of these, alkaline batteries had a market share of some 70%, followed by zinc-chlorine batteries with a market share of about 20% and the remainder being other types of batteries including rechargeable batteries. These batteries are typically the AAA, AA, C, D and 9V sizes. However, other batteries for devices such as mobile phones, hearing aids, MP3 players, watches, power tools and laptops are often prismatic, button cell or polymer batteries or other i.e. custom design batteries. These batteries including the custom design batteries are more difficult to treat as they are odd sizes. About 8% of all batteries sold in Europe are rechargeable. However, as with all batteries, rechargeable batteries also have a limited lifespan and are added to the waste stream at some point.

Due to the large number of batteries produced each year, waste batteries are a possible resource for metals such as rare earths, zinc and other chemicals.

Moreover environmental concerns of leaking waste batteries, the move to recycle, increased cost of raw materials and legislation, for example the European Battery Directive, are all drivers towards increased levels of battery recycling.

A recycling rate of over 95% for lead-acid batteries has been achieved in Europe. Therefore, lead-acid batteries are no longer discussed.

Printed circuit boards (PCBs) are used to mechanically support and electrically connect electronic components using conductive pathways. PCBs are present in almost all electric and electronic equipment such as televisions, computers, mobile phones, electrical tools and medical equipment.

The European Waste Electrical and Electronic Equipment (WEEE) Directive stipulates that EU member states re-use, recycle, and recover components from electrical and electronic equipment rather than landfilling it. But despite the legislation the recycling rate is still small. For instance in 2002 only 15% of the 50,000 tonnes of PCBs produced in the UK were recycled. In Europe alone about 400,000 tons of waste PCBs are discarded every year, presenting a large amount of waste and a potential loss of valuable resources.

PCBs contain metals, such as gold, palladium, silver, nickel, copper, iron, zinc, tin and others from the electrical components and the solder used to attach the electrical components to the PCBs. Often the concentrations of gold, palladium and other precious metals in PCBs exceed the concentration in natural ores, making waste PCBs a rich resource. In addition PCBs may contain glass fibre, paper and resin.

A number of different processes for the recycling of waste batteries are described in the literature. Recent reviews of the current state of the art of battery recycling processes are provided by: (1) Review of the Literature Regarding Disposal of Household Batteries, prepared for the National Electrical Manufacturers Association, 1300 North 17th Street, Suite 1752, Rosslyn, Va. 22209 USA, December 2007; (2) A. M. Bernardes, D. C. R. Espinosa, J. A. S. Tenório, Recycling of batteries: a review of current processes and technologies, Journal of Power Sources 130 (2004) 291-298. More detailed information on single or multiple use batteries is provided by D. Linden, T. B. Reddy (Eds.), Handbook of Batteries, $3^{rd}$ ed., McGraw-Hill, New York, 2002.

U.S. Pat. No. 5,632,832 discloses a pyrolysis process for reclamation of batteries. Preferably the batteries are sorted to type to ensure the solid pyrolysis product is composed of one type of metal or metal mixture making recovery of the individual components by other processes easier. The batteries are fed by an auger into a crusher, which reduces the batteries to about ½" mesh. The crushed material is transferred by another auger into a pyrolysis chamber, which is maintained at a pressure below atmospheric. In the pyrolysis chamber the battery material is pyrolised at temperatures between 350 and 650° F. The pyrolysis vapours are condensed to a liquid for further processing and the non-condensables are sent to further treatment. The solid materials remaining are discharged by another auger into a bin as product to be sent to other processes. Drawbacks of this process include the large number of augers moving the material, as they may be prone to mechanical failure and the inability of this process to segregate the various solid components during the pyrolysis step. In addition, the batteries must be crushed to a fine powder and should be sorted according to type to improve the quality of the products.

WO 2009/028795 A3 discloses a process for the recycling of zinc-carbon and alkaline batteries. It involves firstly crushing the waste batteries, secondly separating the metals with a metal separator, and thirdly pulverising the remaining material before entering it into a pyrolysis furnace to recover materials such as manganese dioxide. Potential drawbacks of this process include that only alkaline and zinc-carbon batteries can be treated and the high energy requirements of the pulverisation processes. In addition this process requires a large number of unit operations.

US Patent Publication number US2012/0227589 A1 discloses a process in which the waste batteries are first shredded into a feedstock. This feedstock is dried at elevated temperatures in a rotatable tunnel oven equipped with a spiral vane to ensure proper mixing and drying. The dried material is sieved. The finer section composed of zinc oxide, manganese oxide and other materials are recovered as a finished product to be fed to other processes. The coarser fraction, also known as fluff, is composed of shredded steel casings, brass, paper, plastic and other materials. The steel is separated by a magnetic separator and sold off. The remainder of the fluff composed of plastics and paper may be burned to generate heat. Potential drawbacks of this process include the high energy requirements of pulverisation. In addition, this process requires a large number of unit operations. Hence from an economic point of view it would be best to minimise the number of unit operations and avoid pulverisation.

A Canadian patent 2 793 142 discloses a pyrometallurgical battery recycling method. The waste batteries are first sorted to type and the button-cell batteries are removed, second the batteries are chopped or crushed into pieces approximately one quarter inch or less, to produce a fine particulate matter. In a third step the iron is removed by magnetic separators and lastly reusable materials are recovered by a refining or smelting process. A potential problem with this process is that the waste batteries must be sorted to type; generally requiring human intervention. In addition a smelting operation is expensive as high operating temperatures are required. EP 2 450 991 A1 discloses a hydrometallurgical process to treat waste lithium and nickel metal hydride batteries. As this process is a hydrometallurgical process it is specifically designed for the above mentioned types of batteries, it cannot treat alkaline and zinc-carbon batteries. Therefore, the latter batteries must be removed from the incoming waste batteries stream. But sorting of batteries to type is labour intensive. Moreover alkaline and zinc-carbon batteries represent the bulk of all batteries; hence from an economic point of view it would be best to include such batteries in a recycling process.

Two general problems are associated with treating batteries by chemical or hydrometallurgical methods. First the chemicals recovered are of low value and second a wastewater stream must be dealt with.

U.S. Pat. No. 5,888,463 discloses another hydrometallurgical process for the recovery of lithium in the form of various lithium salts. First the batteries containing lithium are cryogenically cooled in liquid nitrogen to reduce the reactivity of lithium, second the cooled batteries are shredded, and third the mass is reacted with water containing LiOH to reduce lithium metal still contained in the batteries to lithium salts. The salts are precipitated by adding sodium carbonate and by oversaturation. The resulting slurry can be pumped off to be treated further. As this process is a hydrometallurgical process it is specifically designed for lithium containing batteries, it cannot treat, for example, alkaline and zinc-carbon batteries. Moreover, alkaline and zinc-carbon batteries represent the bulk of all batteries; hence from an economic point of view it may be best to include such batteries in a recycling process. In addition cryogenic cooling of batteries is energy expensive.

U.S. Pat. No. 7,820,317 B2 discloses another hydrometallurgical process for treating waste lithium anode batteries. First the batteries are shredded in an inert atmosphere to prevent lithium reacting with air. Second the metal casing, paper, plastics and copper are removed by physical treatment i.e. magnetic separation and densification and third the lithium and cobalt is precipitated via various chemical and electrolytic treatments. These treatments are followed by hydrolysis to recover lithium and electrolysis to recover cobalt. As this process is a hydrometallurgical process it is specifically designed for lithium batteries, it cannot treat, for example, alkaline and zinc-carbon batteries. Moreover alkaline or zinc-carbon batteries are most common; hence from an economic point of view it may be best to include such batteries in a recycling process.

EP 1454376 B1 discloses another hydrometallurgical process which is aimed at recovering zinc and manganese from alkaline batteries. Again the batteries are first shredded, second the metal casing is removed by a magnetic separator. Third the resulting mass is sieved to remove paper and plastic materials and the fine fraction is washed with sulphuric acid aided by ultrasound. The solution is treated to separate zinc and manganese. This process has disadvantages similar to the other hydrometallurgical processes described above.

While shredding overcomes some process difficulties for handling a bulky material of varying size, it greatly increases the capital and energy requirements of these processes. Hence it would be desirable from an economic point of view if the batteries would only need to be cut rather than shredded or powdered. It would also be desirable to avoid sorting the batteries to type and reducing the number of unit operations before a product(s) is obtained.

Therefore, a cost effective process capable of dealing with all types and shapes of household batteries capable of recovering valuable chemical compounds appears to be lacking.

A number of different processes for the recycling of printed circuit boards (PCBs) based on mechanical, hydrometallurgical and pyrometallurgical processes or combinations thereof are described in the literature. Recent reviews of the current state of the art of PCBs recycling processes and other general information are provided by: (1) I. de Marco, B. M. Caballero, M. J. Chomón, M. F. Laresgoiti, A. Torres, G. Fernández, S. Arnaiz, Pyrolysis of electrical and electronic wastes, Journal of Analytical and Applied Pyrolysis 82 (2008) 179-183; (2) Goosey M, Kellner R., A scoping study: end-of-life printed circuit boards, UK: Intellect and the Department of Trade and Industry, 2002; (3) Hugo Marcelo Veit, Andréa Moura Bernardes, Jane Zoppas Ferreira, Jorge Alberto Soares Tenório, Célia de Fraga Malfatti; Recovery of copper from printed circuit boards scraps by mechanical processing and electrometallurgy; Journal of Hazardous Materials B137 (2006) 1704-1709; (4) J. Molto, R. Font, A. Gálvez, J. A. Conesa, Pyrolysis and combustion of electronic wastes, Journal of Analytical and Applied Pyrolysis 84 (2009) 68-78; (5) Jirang Cui, Eric Forssberg, Mechanical recycling of waste electric and electronic equipment: a review, Journal of Hazardous Materials B99 (2003) 243-263; (6) F. O. Ongondo, I. D. Williams, T. J. Cherrett, How are WEEE doing? A global review of the management of electrical and electronic wastes, Waste Management 31 (2011) 714-730; (7) Nuria Ortuño, Julia Moltó, Silvia Egea, Rafael Font, Juan A. Conesa, Thermogravimetric study of the decomposition of printed circuit boards from mobile phones, Journal of Analytical and Applied Pyrolysis 103 (2013) 189-200; (8) J. Li, P. Shrivastava, Z. Gao, H-C Zhang, Printed Circuit Board Recycling: A State-of-the-Art Survey, IEEE Transactions on Electronics Packaging Manufacturing, Vol. 27, No. 1 January 2004; (9) L. Flandinet, F. Tedjar, V. Ghetta, J. Fouletier, Metals recovering from waste printed circuit boards (WPCBs) using molten salts, Journal of Hazardous Materials, 213-214, (2012) 485-490 and (9) William J. Hall, Paul T. Williams, Separation and recovery of materials from scrap printed circuit boards, Resources, Conservation and Recycling 51 (2007) 691-709. More information on PCBs, its design, fabrication, solder material and so forth may be found in: Clyde Coombs (editor), Printed Circuits Handbook, McGraw Hill, 6$^{th}$ edition, 2007.

Because of their composite nature (metals, resin, paper, plastics, electronic parts etc.) waste PCBs are difficult to recycle.

A promising technology of recycling PCBs is pyrolysis. This involves the use of heat in the absence of oxygen to break the PCBs down into pyrolysis gas, pyrolysis liquid, glass and metals. The chemistry of waste PCBs pyrolysis is well established. On average pyrolysis products of PCBs are composed of ~70 wt % residue (metals, glass, etc.), ~23 wt % pyrolysis oil, and ~6 wt % gas. This gas may be burned to self-sustain the PCB recycling process.

PCBs are graded into three categories depending on their precious metal i.e. gold, platinum, palladium content:

- Low grade material comprises television, printer, pocket calculator boards and power supply units and laminate offcuts. Such PCBs contain less than 100 ppm gold.
- Medium grade scrap PCB is typically from PCs, laptops etc.
- High grade material such as mobile phones, PCs etc. comprises PCBs with gold, platinum and palladium concentrations higher than natural ore making recycling of these metals from PCBs economically interesting by traditional methods. Such PCBs contain more than 200 ppm gold.

Because of the low precious metal content of low or medium value PCBs it is generally uneconomical to recycle such PCBs.

Current industrial recycling methods focus on the recovery of the valuable metals, whereas the remainder is landfilled. Valuable metals to be recoverable from waste PCBs are the various metals especially the precious metals. On average PCB contains among others the following metals: copper 11-35%; silver 1,000-3,000 ppm; lead 1.5-4.5%; gold 200-1,000 ppm; tin 0.8-2.0%; palladium 300-1,000 ppm. Furthermore platinum, antimony, cobalt, indium, zinc and tin may be contained in PCBs. High grade PCBs may contain a higher gold and palladium concentration than natural ore making recycling of these metals from PCBs economically interesting. In addition, the copper concentration with 11-35% is high.

Pyrometallurgy is a traditional technology to recover non-ferrous metals from waste PCBs. Pyrometallurgy includes incineration, smelting, melting and reactions in a gas phase at high temperatures (typically >1,000° C.). However, such processes are expensive due to the high operating temperatures and are only economic for high grade PCBs.

Hydrometallurgy is another traditional technology for the recovery of precious metals from waste PCBs. The main steps in hydrometallurgy consist of firstly a series of acid or caustic leaches, secondly separation and purification procedures such as precipitation of impurities, solvent extraction, adsorption and ion-exchange to isolate and concentrate the metals of interest and thirdly electro-refining process, chemical reduction, or crystallization for metal recovery.

Disadvantages of hydrometallurgical processes include that they produce waste liquids and sludges, which must be disposed of. Moreover, hydrometallurgical processes tend to be time consuming and complicated. Therefore, the overall cost of these processes may be large. Hence from an economic point of view a simpler process would be desirable.

US 2004/01779985 A1 discloses a hydrometallurgical process to recover valuable metals from PCBs by contacting the PCBs with a leaching phase based on cupric acid and an alkaline chloride to dissolve the metals in about 1 to 3 hours. This process recovers copper, silver, nickel, tin etc. from a solution and gold by filtration. Disadvantages of this process include long processing times and the general disadvantages of hydrometallurgical processes.

DE 197 153 319 A1 discloses a process whereby the metals present in PCBs are recovered by three consecutive hydrometallurgical unit operations. Prior to treatment the PCBs are shredded to make the metals available to the chemicals of the hydrometallurgical processes. Disadvantages of this process include the number of unit operations, the shredding of the PCBs adding to operating costs and the general disadvantages of hydrometallurgical processes.

U.S. Pat. No. 5,683,040 discloses a process requiring first removal of the batteries, mercury switches and some capacitors before the PCBs are mechanically broken down into smaller pieces. The pieces are then cryogenically embrittled with liquid nitrogen and comminuted in a hammer mill. Iron particles can subsequently be removed magnetically whereas other metals can be removed by corona-roller separators. Disadvantages of this process include the cryogenic cooling of the PCBs as it is energy intensive. Furthermore the use of a hammer mill and various metal separation unit operations increase capital and operational costs.

WO 00/43574 discloses another hydrometallurgical process for the selective dissolution of tin and/or lead- or tin-containing alloys from PCBs with an acid solution to form various metal salts. After dissolution an electrolytic reduction step regenerates and recovers the metals. Disadvantages of this process include long dissolution times, the handling of chemicals and the number of unit operations.

US 2009/0288956 A1 discloses a process in which the waste PCBs are first pyrolysed to form an ash. The metals are separated from the ash by density separation. The metals are formed into a slurry electrode and placed into an electrolyte bath to electro-refine the metals into bars. Disadvantages of this process include the large number of unit operations increasing capital costs.

U.S. Pat. No. 4,874,486 discloses a waste PCBs pyrolysis recycling process, which is followed by a wet electrolysis process i.e. a hydrometallurgical process. The pyrolysis is executed at temperatures between 450 and 650° C. The resulting pyrolysis slag is subsequently subjected to wet electrolysis. After that step the electrolysis products are crystallised and separated. Disadvantages of this process include the number of unit operations, long processing times increasing capital and operational costs.

U.S. Pat. No. 3,899,322 discloses a process which recovers valuable metals from scrap containing metals. The metal containing scrap, which may be PCBs, are introduced into a furnace containing a molten salt to pyrolytically decompose the scrap and form recoverable metal. Disadvantages include that the scrap PCBs must be cut into small pieces to allow feeding by a screw type feeder. Furthermore the operating temperatures are very high (for example 1,000 to 1,100° C. for the recovery of silver) as the target metals are recovered in molten form increasing capital and operating costs.

U.S. Pat. No. 6,089,479 discloses a process for the treatment of waste PCBs with a molten salt. The PCBs are crushed within the furnace and are carbonized i.e. pyrolysed. It is intended that the glass resin and the carbonized resin parts separate to the top of the molten salt, whereas the copper separates to the bottom of the salt. The scraped off plastic residues and the glass is scrapped off the surface of the salt, whereas the copper is removed from the bottom by a removing device located at the bottom. Disadvantages of the process include that the crusher is exposed to high operating temperatures as are the bottom and top separators making them expensive and possibly susceptible to mechanical failure. Moreover there may be a process problem: the density of most molten salts (for example LiCl—KCl at 450° C.: $\rho=1,600$ kg/m$^3$) is such that the glass ($\rho=2,400-2,800$ kg/m$^3$) will separate to the bottom and not to the top of the molten salt as claimed. Higher density salts are available but these may be expensive, environmentally not benign, toxic, unstable at higher temperatures or combinations thereof. Hence this process may not work as intended or may not be economic. The physical properties of various salts are provided by G. J. Janz, C. B. Allen, N. P. Bansal, R. M. Murphy and R. P. T. Tomkins, Physical Properties Data Compilations Relevant to Energy Storage. II Molten Salts: Data on Single and Multi-Component Salt Systems, Tech. Rep. NSRDS-NBS61-II, US Department of Commerce, 1979.

U.S. Pat. No. 8,308,843 B2 discloses a process in which scrap PCBs are pyrolysed in a reactor filled with molten salt. This reactor operates in batch mode. Air is removed from the reactor by water injection. Disadvantages of this process include that it is a batch rather than a continuous operation, the required number of moving parts i.e. the lid and sealing arrangement of the reactor and the removal of the air (oxygen) by water vapour which may not be sufficient at all times. In addition water is expensive to evaporate, may result in corrosion problems, will contaminate the pyrolysis oil from which it may have to be removed and may result in a wastewater stream. In summary safety, operational and economic concerns may be put forward against this process.

Swiss patent CH 705 803 A1 discloses a process with the primary aim of recovering the electronic parts from scrap PCBs. The process utilises a liquid, for instance organic oil or molten salts, capable of operating at temperatures between 100-350° C. This operating temperature is below the pyrolysis or destruction temperature of the resin of the PCBs. Hence, this process only melts the PCBs. If a molten salt is used the electrical components of the PCBs collect at the bottom, whereas the treated, unpopulated PCBs segregate to the top of the molten salt as are the molten plastics. Disadvantages of this process include that the process is not self-sustaining. Instead additional heat is required to melt the electrical components off the PCBs and keep the salt molten. Moreover, the electrical parts recovered by this process are contaminated with salt and were exposed to high temperatures which may reduce their resale value due to possible quality issues. In addition, the electrical parts will have to be manually sorted, which may also be expensive. Moreover, a screw is used to remove the electrical components from the molten salt. This screw may be prone to mechanical failure and corrosion especially as the molten metal (solder) collects at the bottom.

WO2013/094879 and WO2013/094878 disclose a process for the destruction of various materials utilising molten metal. In this process the molten metal is circulated by a pump and sprayed onto the feed stock. The molten metal re-circulating line may contain a filter to separate some materials from the molten metal. Disadvantages of these processes include the highly corrosive nature of moving (re-circulated and sprayed) molten metal requiring special materials of construction, which hence may result in an uneconomic process for the recycling of batteries and PCBs.

A general problem with currently employed mechanical, pyrometallurgical and hydrometallurgical processes for the treatment of PCBs and waste batteries is that the concentration of valuable metals such as gold, palladium, silver or mischmetal is low. Hence, generally speaking, only PCBs and batteries with high concentrations of the target elements are recycled. As a result a process capable of increasing the concentration of the target elements (metals) would be desirable.

It is therefore an object to provide a system and method for the recycling of batteries, PCBs and other waste streams or materials that overcomes at least one of the above mentioned problems.

SUMMARY

According to the invention there is provided, as set out in the appended claims, a system of recycling of waste composite feed materials such as printed circuit boards (PCBs), batteries, catalysts, plastic, plastic composites such as food packaging materials, for example Tetra Pak®, mattresses, compact disks (CDs, DVDs), automobile shredder residue (ASR), electric cable wastes, liquid display panels, mobile phones of various sizes or combinations of the above, the system comprising:

means for charging said feed material from said charging vessel (1, 30) into separation/pyrolysis chamber (8) comprising of a separation/pyrolysis liquid (7);

means for allowing the heavy and light solid products associated with said feed material to separate within said separation/pyrolysis liquid (7);

means for removing the product vapours and said light solid products via vapour/top dross removal line (23) or extractor (22) or both from the surface of said separation/pyrolysis liquid (7); and/or means for re-circulating said separation/pyrolysis liquid (7) through filter (40) to remove said suspended light solid products;

means for removing said heavy solid products from the bottom or somewhere between the liquid surface of said separation/pyrolysis liquid (7) and the bottom of separation/pyrolysis liquid (7) with solids removal device (15, 16, 17) or alternatively by a drain (20, 21); and means for removing said light solid products via top dross removal device (32) from the surface of said separation/pyrolysis liquid (7).

In one embodiment said feed material is cut or sliced or both prior to entering said charging vessel (1, 30).

In one embodiment said separation/pyrolysis chamber (8) comprises a substantially U shaped structure.

In one embodiment said separation/pyrolysis chamber (8) comprises of one or more interconnected legs but at least two legs (A, B) so that at least one leg (B) can be opened to the atmosphere without emitting said product vapours to the atmosphere from said leg (B) when the surface of said separation/pyrolysis liquid (7) in said leg (B) is exposed to the atmosphere.

In one embodiment said separation/pyrolysis chamber (8) comprises of a sloped bottom of between 10 and 60 degrees so that said heavy solid products collect at the low point of said separation/pyrolysis chamber (8).

In one embodiment said slope of said separation/pyrolysis chamber (8) changes its degree at least once.

In one embodiment said extractor (22) comprises a lance or other extractor means.

In one embodiment there is provided means for separating said product vapours and said light solid products in cyclone (24).

In one embodiment said separation/pyrolysis chamber (8) comprises of a plurality of said low points.

In one embodiment said separation/pyrolysis chamber (8) is equipped with a plurality of drains located at or near said low points.

In one embodiment said solids removal device (15, 16, 17) comprises of a plurality of solids removal devices which are either movable or stationary.

In one embodiment said solids removal device (15, 16 or 17) removes said heavy solid products from one or a plurality of low points of said pyrolysis chamber (8).

In one embodiment said charging vessel (1, 30) is equipped with a conveyor (31) or a ram system designed to charge said feed material into said separation/pyrolysis chamber (8).

In one embodiment said charging vessel (1, 30) is installed vertically, horizontally or sloped between 90 and zero degrees or combinations thereof.

In one embodiment said charging vessel (1, 30) comprises a plurality of vessels.

In one embodiment an auger is used to remove said light pyrolysis products from said separation/pyrolysis chamber (8).

In one embodiment said light pyrolysis products and said pyrolysis vapours are removed from said pyrolysis chamber (8) via a single or a plurality of slots located in the sidewall of said pyrolysis chamber (8).

In one embodiment said filter (40) is comprised of a plurality of filters installed in series or in parallel or combinations thereof.

In one embodiment said cyclone (24) is comprised of filters, cyclones, zig-zag sifters or eddy flow separators installed in series or in parallel or combinations thereof.

In one embodiment one or a plurality of plungers (35) are used to submerge heavy materials floating on the surface of said separation/pyrolysis liquid (7).

In another embodiment there is provided a method of recycling of waste composite feed materials such as printed circuit boards (PCBs), batteries, catalysts, plastic, plastic composites such as food packaging materials, for example Tetra Pak®, mattresses, compact disks (CDs, DVDs), automobile shredder residue (ASR), electric cable wastes, liquid display panels, mobile phones of various sizes or combinations of the above, the system comprising:

charging said feed material from said charging vessel (1, 30) into separation/pyrolysis chamber (8) comprising of a separation/pyrolysis liquid (7);

allowing the heavy and light solid products associated with said feed material to separate within said separation/pyrolysis liquid (7);

removing the product vapours and said light solid products via vapour/top dross removal line (23) or extractor (22) or both from the surface of said separation/pyrolysis liquid (7); and/or re-circulating said separation/pyrolysis liquid (7) through filter (40) to remove said suspended light solid products;

removing said heavy solid products from the bottom or somewhere between the liquid surface of said separation/pyrolysis liquid (7) and the bottom of separation/pyrolysis liquid (7) with solids removal device (15, 16, 17) and/or by a drain (20, 21); and removing said light solid products via top dross removal device (32) from the surface of said separation/pyrolysis liquid (7).

In one embodiment there is provided the step of separating said product vapours and said light solid products in cyclone (24).

In one embodiment said separation/pyrolysis liquid (7) is a molten non-ferrous metal and selected from at least one of zinc, tin, aluminium, lead, copper or alloys thereof.

In one embodiment said separation/pyrolysis liquid (7) is a molten salt such as LiCl, KCl, KOH, NaOH, cyanides, nitrates, nitrites or combinations thereof.

In one embodiment said separation/pyrolysis liquid (7) is an organic liquid with a boiling point higher than 150° C.

In one embodiment a gate opened and closed periodically configured to ensure that the contact or reaction time of the feed material with the separation/pyrolysis liquid (7) is increased.

In one embodiment the step of re-circulating said separation/pyrolysis liquid (7) through filter (40) to remove said suspended light solid products.

BRIEF DESCRIPTION OF THE DRAWINGS

The characteristics and advantageous characteristics of the present invention are detailed in this section based on the accompanying drawings, given as a non-restrictive example, with reference to the attached drawings wherein.

DRAWINGS LEGEND

Figure 1:
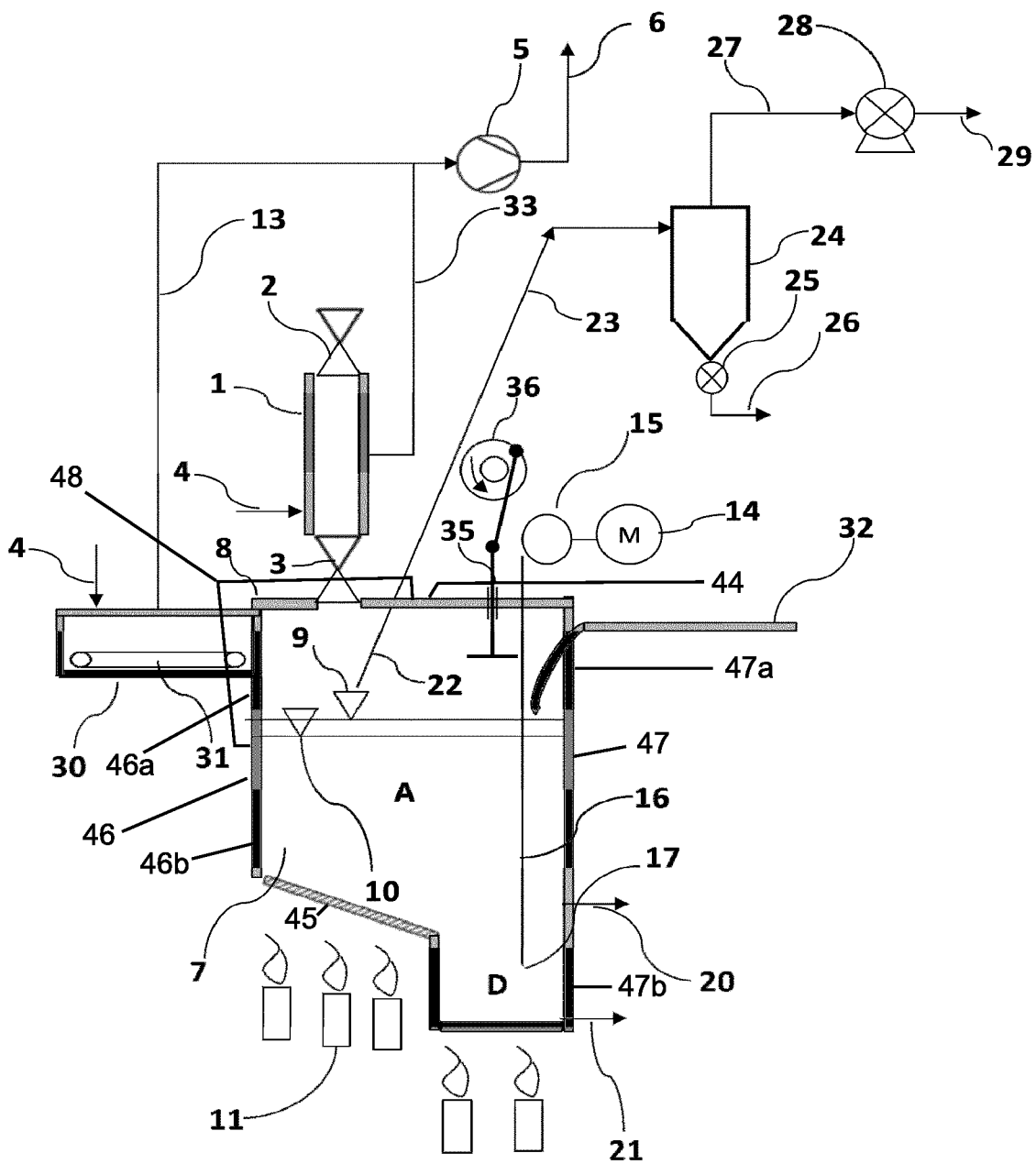
FIG. 1 is a cross sectional drawing of the separation chamber of the battery recycling process utilising a molten metal.
Figure 2:
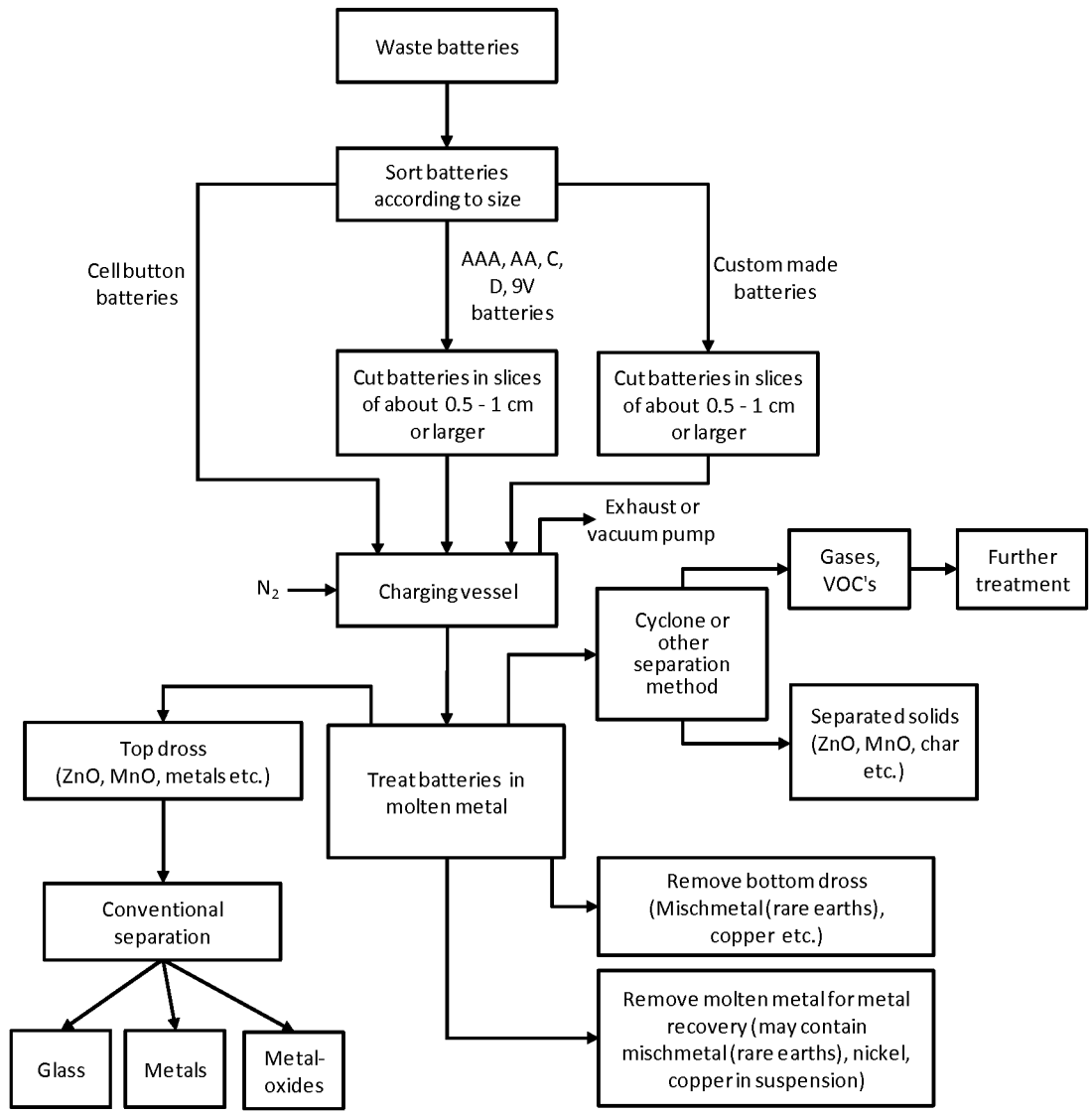
FIG. 2 gives a process flow diagram of the proposed battery recycling process utilising a molten metal.
Figure 3:
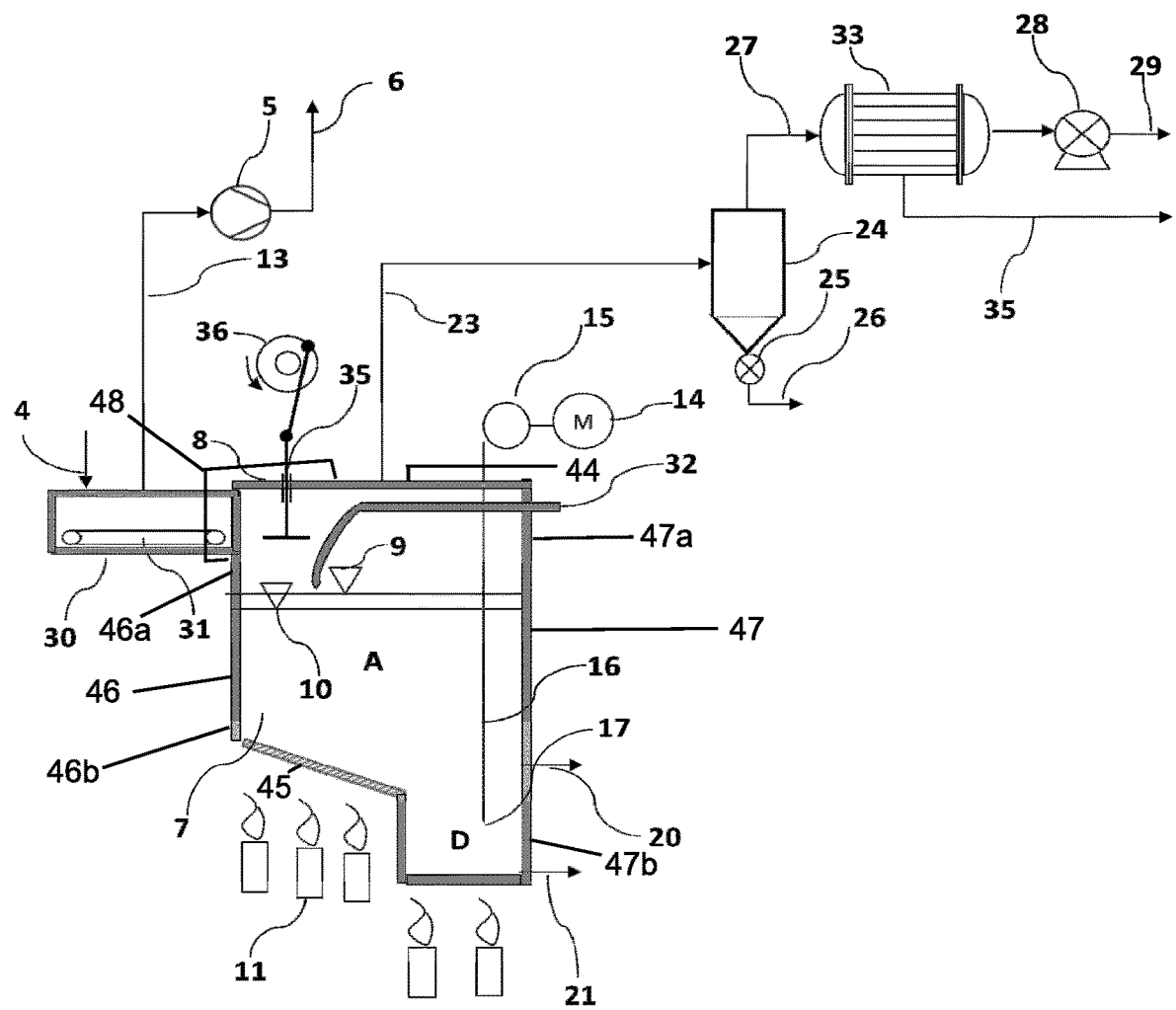
FIG. 3 is a cross sectional drawing of the separation/pyrolysis chamber of the PCBs recycling process utilising a molten metal.
Figure 4:
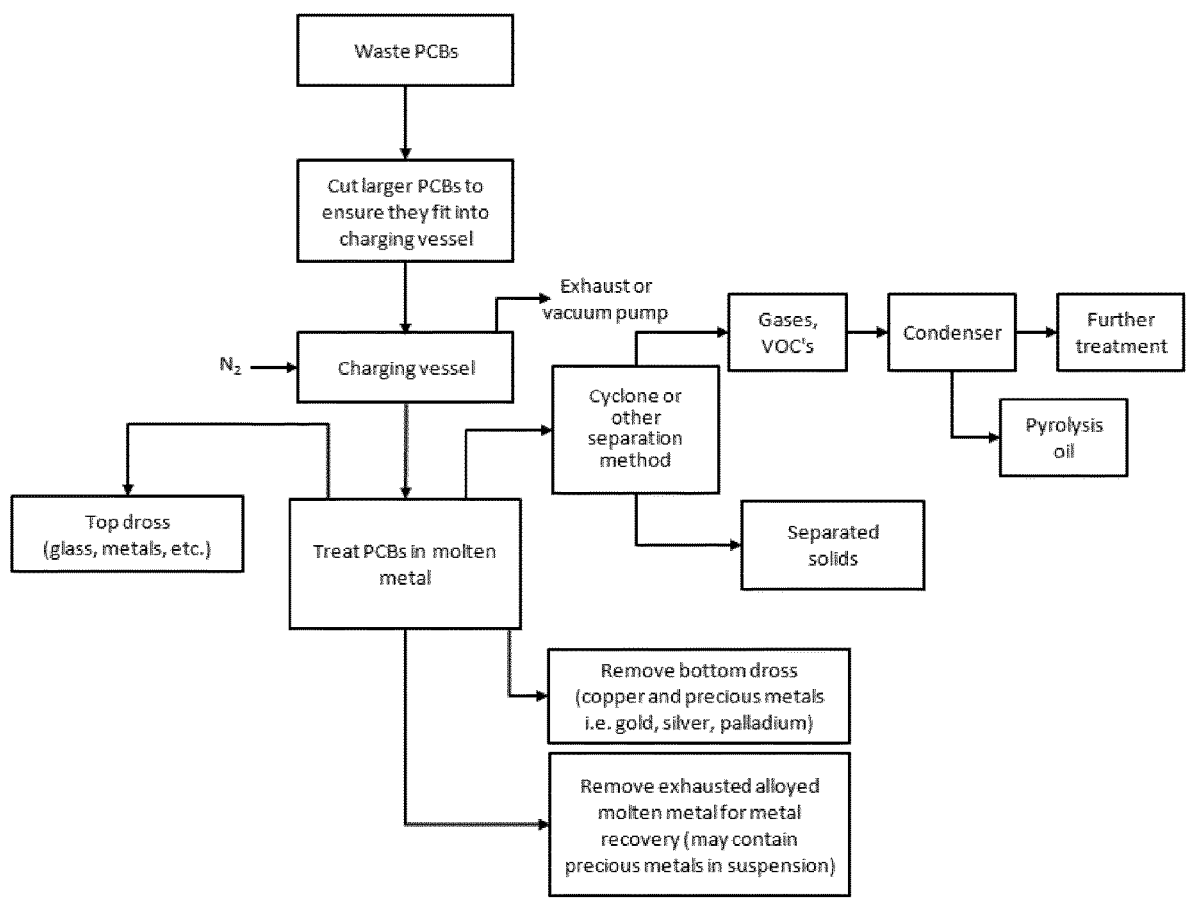
FIG. 4 gives a process flow diagram of the proposed PCBs recycling process utilising a molten metal.

1. Charging chamber
2. Charging chamber cold valve
3. Charging chamber hot valve
4. Nitrogen
5. Vacuum pump
6. Vacuum pump exhaust
7. Separation/pyrolysis liquid
8. Separation/pyrolysis chamber
9. Level of top dross in leg A
10. Level of separation liquid in leg A
11. Heater
12. Leg A and B separator
13. Vacuum line
14. Motor
15. Solids removal device
16. Solids removal device (chain or similar)
17. Solids removal device (basket or similar)
18. Leg B cover
19. Upper drain
20. Middle drain
21. Lower drain
22. Extractor
23. Vapour removal line
24. Cyclone
25. Cyclone rotary valve
26. Solid removal line
27. Vapour line
28. Fan
29. Vapours to further processing
30. Charging vessel
31. Conveyor
32. Top dross removal device
33. Condenser
34. Pyrolysis oil condensate
35. Plunger
36. Motor/gearbox and drive train for plunger
37. Pump suction pipe 38. Pump
39. Pump discharge pipe
40. Filter
41. Filter discharge
42. Gate
43. Mechanism to operate gate
44. Top
45. Bottom
46. First Side Wall
46a. First Side Wall Upper Portion
46b. First Side Wall Lower Portion
47. Second Side Wall
47a. Second Side Wall Upper Portion
47b. Second Side Wall Lower Portion
48. Charging End
D. Lower Area of Bottom

DETAILED DESCRIPTION

Referring now to FIGS. 1 to 8, illustrating preferred embodiments of the invention, showing waste batteries and waste PCBs to be treated. In the figures, the same constitutional elements or components are represented by the same reference numerals as given in the drawings legend above.

For the following non-restrictive examples, the present invention is described by the example of waste household batteries and PCBs. The process is characterised as a metal concentration, gravity separation and a pyrolysis process executed in one step. The metals such as mischmetal, gold, palladium, nickel, lead either form an alloy with the molten metal, separate as a distinct phase or form top or bottom dross, whereas plastic, paint and paper are pyrolysed. In the following examples it is assumed that a separation/pyrolysis liquid 7 of the battery recycling example is a molten metal, for example zinc, whereas for the example of the PCB recycling process the separation/pyrolysis liquid 7 is a molten salt, for example the eutectic (58.2 mol % LiCl and 41.8 mol % KCl) or near eutectic mixture of LiCl—KCl. Specific information on this salt is provided by: A. S. Basin, A. B. Kaplun, A. B. Meshalkin and N. F. Uvarov, The LiCl—KCl Binary System, Russian Journal of Inorganic Chemistry, 2008, Vol. 53, No. 9, pp. 1509-1511). Other salts such as ternary nitrate-nitrite salts, for example sodium nitrate-sodium nitrite-potassium nitrate ($NaNO_3$—$NaNO_2$—$KNO_3$), having, for instance, been used as s heat transfer media on an industrial scale in solar power installations. The physical properties of these and many other salts may be found in: G. J. Janz, C. B. Allen, N. P. Bansal, R. M. Murphy and R. P. T. Tomkins, Physical Properties Data Compilations Relevant to Energy Storage. II Molten Salts: Data on Single and Multi-Component Salt Systems, Tech. Rep. NSRDS-NBS61-II, US Department of Commerce, 1979.

The waste battery recycling process works as follows: In a first step (see FIG. 2) the received waste batteries are sorted according to size or according to the machine which slices them. Custom made batteries and AAA, AA, C, D and 9V batteries are cut into slices about 0.5 to 1 cm long or longer, whereas button cell batteries may not require cutting or they may to be cut into sections about 0.5 cm or shorter. The batteries may also be cut along their longitudinal axis.

The batteries cut or not cut are fed into charging vessel 1 (see FIG. 1; charging vessel 30 is not used in this example). Once the charging vessel 1 is full, the charging vessel cold valve 2 is closed; the air in the vessel is removed by vacuum pump 5 and subsequently broken with nitrogen 4 and repeated until charging vessel 1 is inerted.

Then the charging chamber hot valve 3 is opened and the batteries are charged into separation/pyrolysis liquid 7. Due to the high temperature of the separation/pyrolysis liquid 7 (typically >350° C.), the batteries readily decompose and separate into vapour, top and bottom dross.

The light solids, commonly named top dross, are allowed to build up in the separation/pyrolysis chamber 8 to a level until the top dross must be removed either manually or by other means (see FIG. 1; top dross removal device 32) via opening the top section of the separation/pyrolysis chamber 8.

The top dross may be composed of graphite, cobalt oxide, aluminium oxide, zinc oxide, manganese oxide and other materials less dense than the separation/pyrolysis liquid 7 and may be treated by others.

The vapours and some of the top dross are continuously removed from the separation/pyrolysis chamber 8 by vapour/top dross removal line 23. There may be an extractor 22 protruding into the separation/pyrolysis chamber 8. Solids entrained in the vapour stream are removed from the vapour stream by a cyclone 24. The collected solids exit the system via cyclone rotary valve 25 and solids removal line 26 for further processing. The vapours are also routed for further processing 29 or may provide energy 11 for the process. The suction driving force for the vapour removal is provided by fan 28.

Heavy compounds such as rare earths or mischmetal, cobalt, nickel, manganese, stainless steel and cadmium oxide separate to the bottom of the separation/pyrolysis chamber 8 and, due to the slope of this wall, accumulate in area D (see FIG. 1) where they can be removed by a number of drain points 20, 21 or by solids removal device 15-17.

Lead, aluminium and other metals may form an alloy with the separation/pyrolysis liquid 7. These materials will be removed once it has been determined that the separation/pyrolysis liquid 7 is exhausted. Then the melt is removed via drains 20, 21 or by solids removal device 15-17 for further processing.

The bottom product i.e. the stainless steel casings of the spend batteries can be removed from the separation/pyrolysis chamber 8 (area D) with solids removal device 15-17. Zinc attached to the casings and other steel or metal parts may be removed by another unit operation.

A plunger 35 may be used to submerge heavy materials floating on the surface of the separation/pyrolysis liquid 7.

A gate 42 can be closed to ensure that the contact or reaction time of the batteries with the separation/pyrolysis liquid 7 is sufficiently long. This is important for the process so that complete separation is achieved. Gate 42 can be opened periodically so that the treated batteries can move by gravity from Leg A to Leg B.

Batteries may also be charged to the separation/pyrolysis chamber 8 via charging vessel 30, which may be equipped with a conveyor 31. The charging vessel 30 is inerted via nitrogen 4 and vacuum line 13.

In summary, the battery recycling process is a metal concentration and gravity separation process combined with pyrolysis representing a new approach to battery recycling. The precious and other metals are collected as top or bottom dross or form an alloy with the molten zinc in the separation/pyrolysis chamber 8. Periodically the metal alloy/mixture accumulating in the chamber is drained and may be treated by another unit operation. Capital and operational cost are reduced as the batteries do not need to be shredded or pulverised.

The PCB recycling process disclosed is a concentrating process for precious and low value metals and at the same time a pyrolysis process for the epoxy, plastic, paper and other materials. As a result also low and medium grade PCBs may be economically treated. Pyrolysis oil may also be produced by this process offering an additional revenue stream to the recovery of the metals.

The PCBs recycling process works as follows: The waste PCBs are charged without mechanical pre-treatment that is, generally, intact into charging vessel 30 (see FIGS. 7 and 8 for a block flow diagram of the process; charging vessel 1 is not used in this example) the air is removed by vacuum pump 5 and broken by nitrogen 4. The PCBs are charged with conveyor belt 31 into the separation/pyrolysis liquid 7. Due to the high temperature of the separation/pyrolysis liquid 7, the PCBs readily decompose and separate into vapour, top and bottom dross.

The light solids such as glass and some metals may collect in the separation/pyrolysis chamber 8 above the collected metal i.e. in area C above level D (see FIG. 7) from where this material is removed periodically by solids removal device 15-17.

The solids removal device 15-17 may operate on a batch basis. During times when 15-17 is idle, the solids removal device 15-17 may be removed from the separation/pyrolysis chamber 8. The top of leg B may be closed with covers 18 to minimise heat losses and for safety reasons.

The vapours and some of the top dross are continuously removed from the separation/pyrolysis chamber 8 by vapour/top dross removal line 23. There may or may not be an extractor 22 protruding into the separation/pyrolysis chamber 8. Solids entrained in the vapour stream are removed from the vapour stream by cyclone 24 or by other means for example a bag filter. The collected solids exit the system via removal line 26 as product or for further processing. The vapours are also routed for further processing 29 or may provide energy 11 for the process. The suction driving force for the vapour removal is provided by fan 28.

Some of the heavy compounds such as stainless steel, copper, gold or palladium but also metals molten at the operating temperature such as zinc, tin or lead separate to the bottom of the separation/pyrolysis chamber 8 and, due to the slope of this wall, accumulate in area D where they may be removed by a number of drain points 20 or 21 or by solids removal device 15-17.

The bottom dross or bottom product such as stainless steel, copper, molten metal and glass may be removed from the separation/pyrolysis chamber 8 (area C, D) with solids removal device 15-17.

Plunger 35 may be used to submerge heavy materials floating on the surface of the separation/pyrolysis liquid 7.

A gate 42 can be closed to ensure that the contact or reaction time of the PCBs with the separation/pyrolysis liquid 7 is sufficiently long. This is important for the process so that complete separation is achieved. Gate 42 can be opened periodically so that the treated PCBs can move by gravity from Leg A to Leg B.

The solids removal device 15-17 may operate on a batch basis. During times when 15-17 is idle, the solids removal device 15-17 may be removed from the separation/pyrolysis chamber 8. The top of leg B may be closed with covers 18 to minimise heat losses and for safety reasons.

As the pressure inside the separation/pyrolysis chamber 8 is only slightly above atmospheric (generally not more than 100 mbar), the liquid level of leg B is nearly equal to the liquid level in leg A. This is due to the fluid statics principle of legs A and B being filled with a continuous fluid.

Some top dross may also form on top of leg B. This dross would also be periodically removed by drossing the surface of the separation/pyrolysis liquid 7.

Some particles may not separate as bottom or top dross. Instead some particles may remain suspended within the separation/pyrolysis liquid 7. These particles are removed by filter 40. Pump 38 is used to pump the molten salt through filter 40 and back to the separation/pyrolysis chamber 8.

In summary this PCB recycling process provides a metal concentration and gravity separation process combined with pyrolysis representing a new approach to PCB recycling. The precious and other metals are collected as top or bottom dross or form an alloy in the separation/pyrolysis chamber 8. Periodically the top and bottom dross are removed from the separation/pyrolysis chamber 8 and the metal alloy/mixture may, for instance, be sold to a third party or treated in a follow on unit operation.

Figure 9:
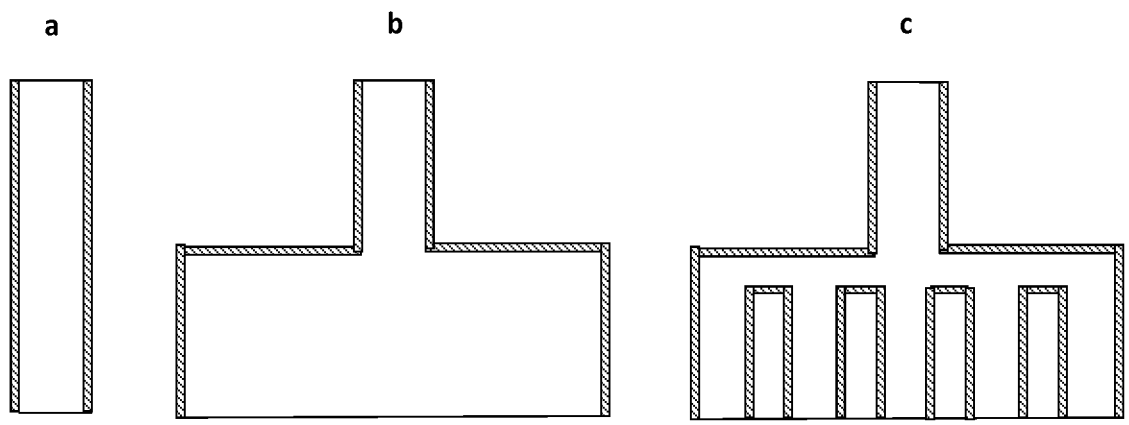
FIG. 9 is a drawing of a number of different extractors.

FIG. 9 illustrates a number of different embodiments that can be used as an extractor, where 'a' show a simple lance type extractor, 'b' a lance extractor with broader opening at one end, and 'c' a manifold type extractor adapted for removing the pyrolysis vapours and light solid pyrolysis products from the surface of the separation/pyrolysis liquid 7.

A desirable characteristic of the present invention is that all types of dry batteries may be treated with this system eliminating the requirement of sorting the batteries to types. Another desirable characteristic of the present invention is that the batteries do not need to be crushed or pulverised or dried reducing energy requirements in comparison to other processes. Another desirable characteristic of the present invention is that the stainless steel battery casings are recovered as scrap increasing the economics of the process.

Another desirable characteristic of the present invention is that low value PCBs can be recycled economically as the process concentrates the metals and may also generate pyrolysis oil. Another desirable characteristic of the present invention is that the PCBs do not need to be shredded prior to processing, minimising the energy requirements of this process.

Figure 5:
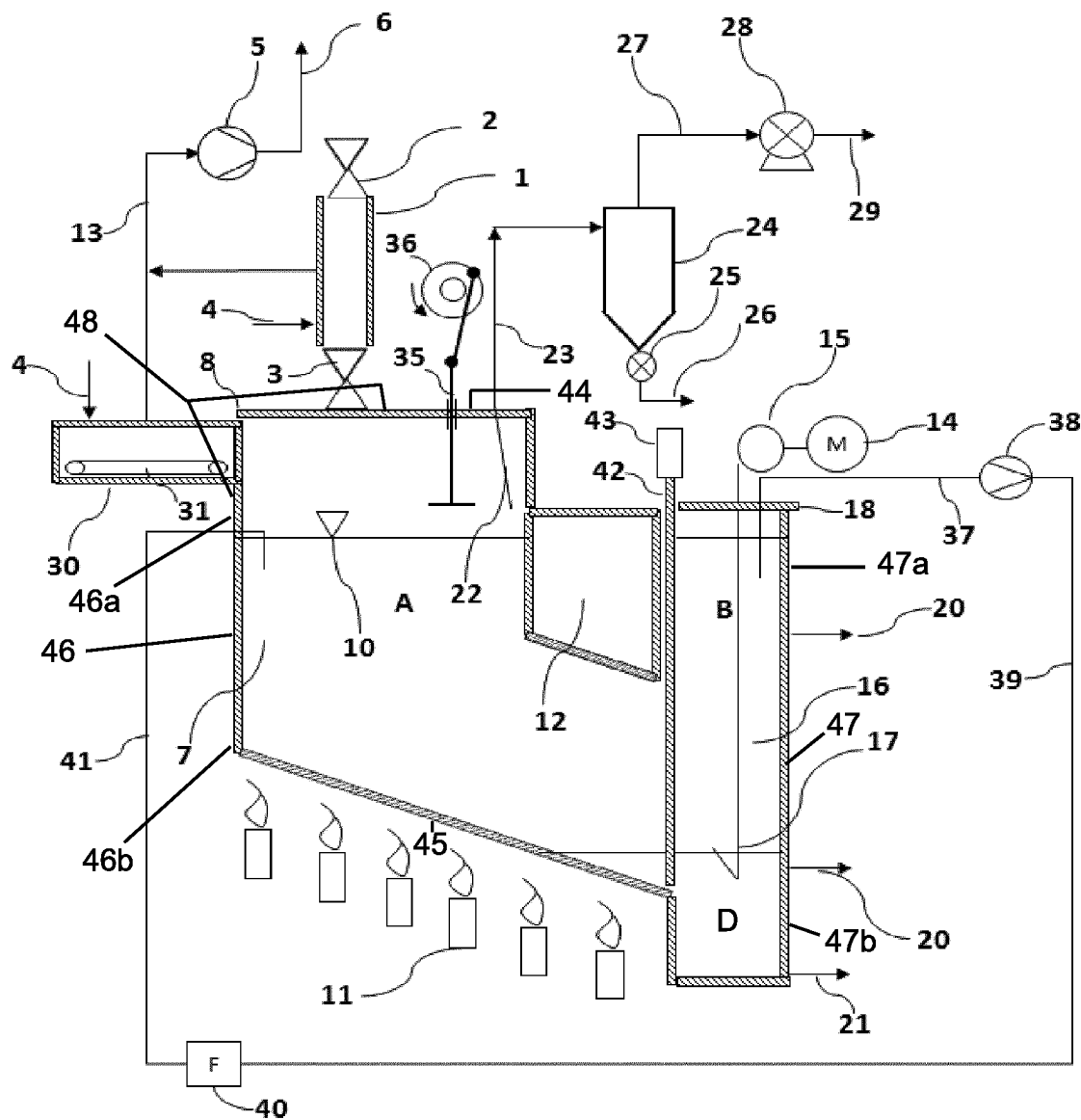
FIG. 5 is a cross sectional drawing of the separation/pyrolysis chamber of the battery recycling process utilising a molten salt.
Figure 6:
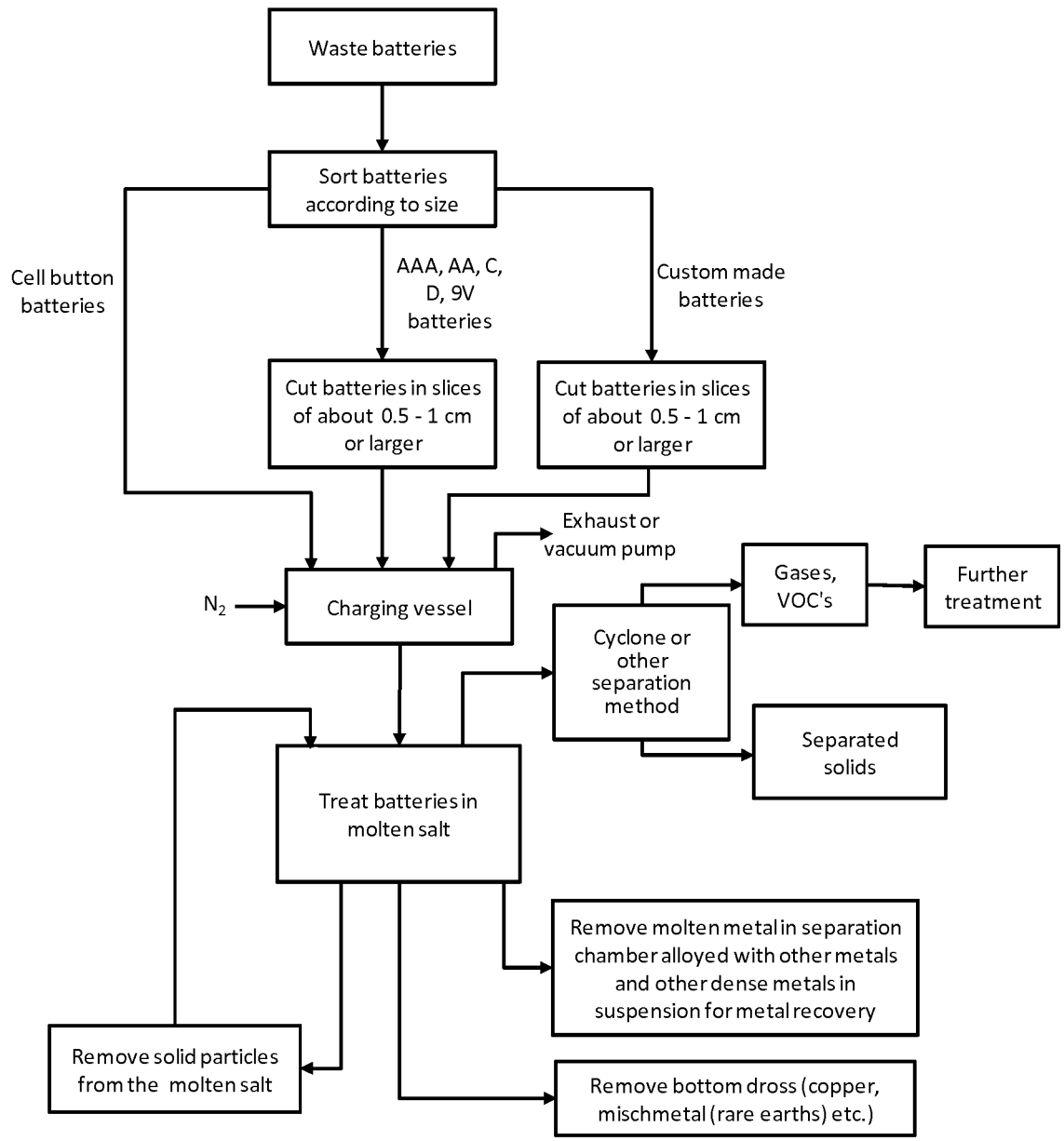
FIG. 6 gives a process flow diagram of the proposed battery recycling process utilising a molten salt.
Figure 7:
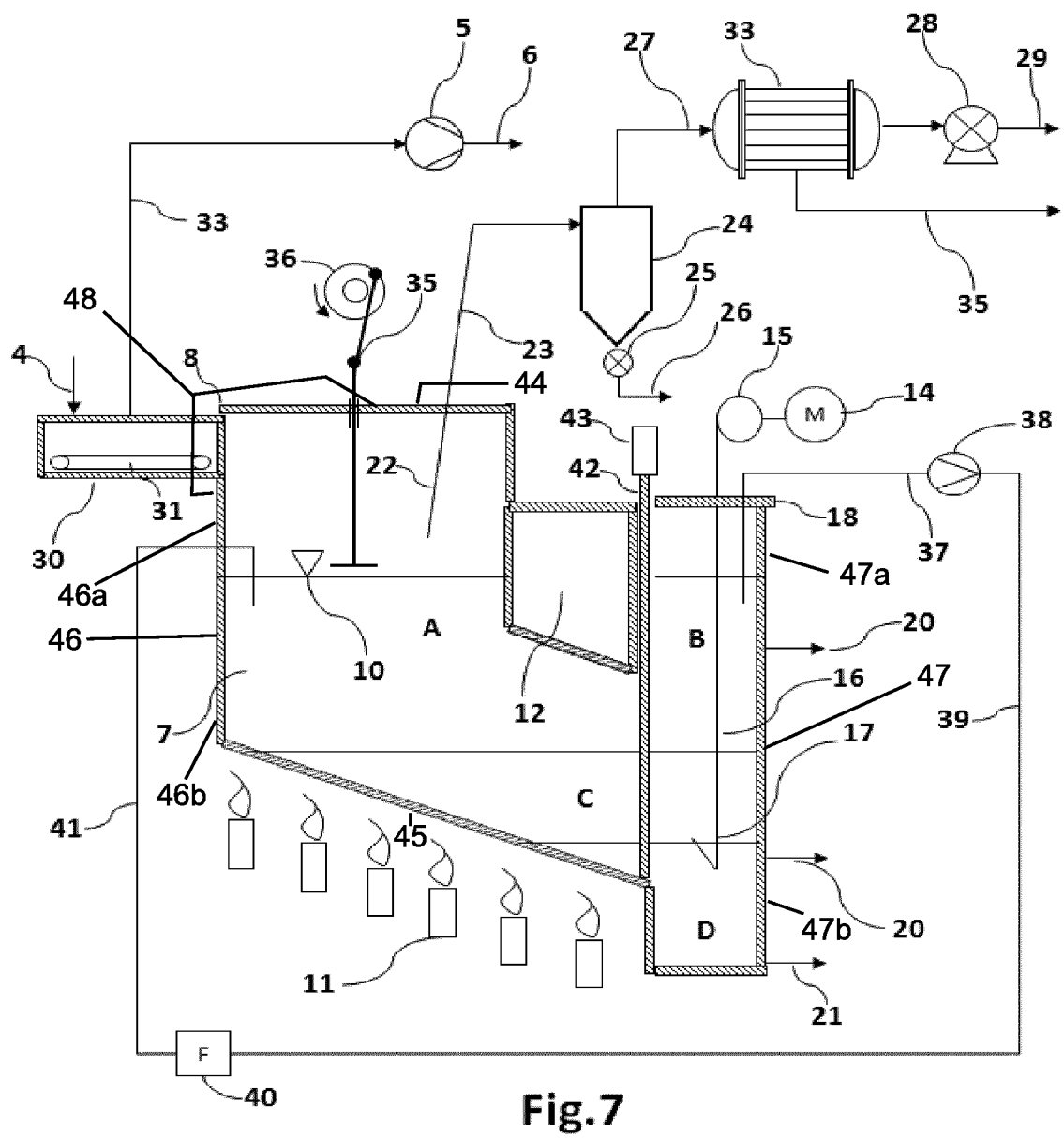
FIG. 7 is a cross sectional drawing of the separation/pyrolysis chamber of the PCBs recycling process utilising a molten salt.
Figure 8:
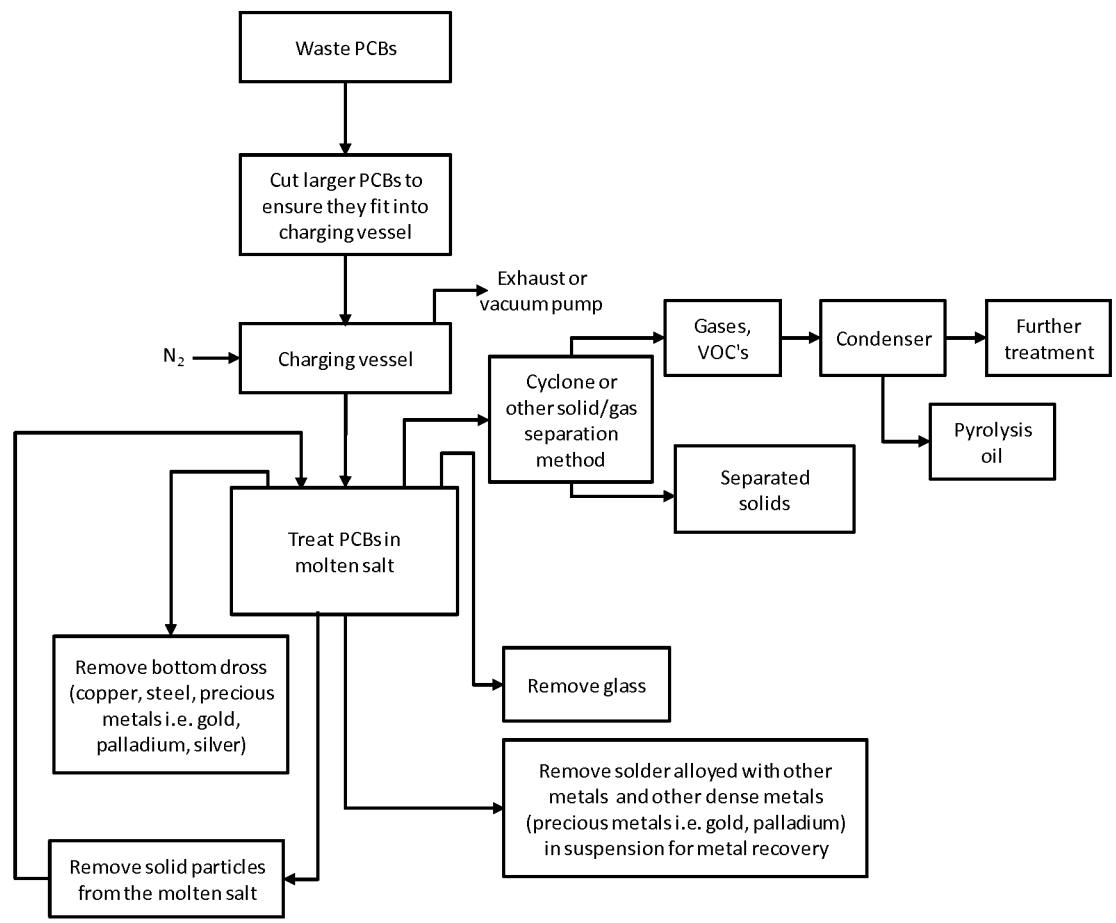
FIG. 8 gives a process flow diagram of the proposed PCBs recycling process utilising a molten salt.

Another desirable characteristic of the present invention is that VOC emissions do not occur from separation/pyrolysis chamber 8 (see FIG. 5, 7). Hence this part of the separation/pyrolysis chamber 8 may be opened to the atmosphere without causing VOC emissions which otherwise may have to be abated. Another desirable characteristic of the present invention is that the process is readily scalable.

It will be appreciated that the invention can be applied to printed circuit boards (PCBs), batteries, catalysts, plastic, plastic composites such as food packaging materials, for example Tetra Pak®, mattresses, compact disks (CDs, DVDs), automobile shredder residue (ASR), electric cable wastes, liquid display panels, hoses and other composite material for example platinum-coated silicon materials, carbon composites, mobile phones or combinations of the above.

In the specification the terms "comprise, comprises, comprised and comprising" or any variation thereof and the terms "include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A system of recycling of waste composite feed material, the system comprising:
   a separation/pyrolysis chamber (8) for containing a separation/pyrolysis liquid (7) during operation, the separation/pyrolysis chamber having:
   a top (44), a bottom (45) opposed the top, a first side wall (46) and a second side wall (47) opposed the first side wall, the first and second side wall each extending between the top and the bottom,
     the first side wall having an upper part (46a) adjacent the top and a lower part (46b) adjacent the bottom, and
     the second side wall having an upper part (47a) adjacent the top and a lower part (47b) adjacent the bottom;
   a charging vessel (1, 30) equipped with means for charging the feed material from the charging vessel into the separation/pyrolysis chamber; the charging vessel being in communication with the separation/pyrolysis chamber at a charging end (48) of the separation/pyrolysis chamber, the charging end being located at the top (44) adjacent the upper part of the first side wall or at the upper part of the first side wall (46a) adjacent the top;
   a heater (11) for heating and maintaining the separation/pyrolysis liquid in a liquid state at a temperature at which the feed material undergoes pyrolysis to form pyrolysis vapours, top dross, and bottom dross;
   the bottom (45) of the separation/pyrolysis chamber being sloped downward relative to said first side wall (46) and the top (44) and sloping away from the charging end of the separation/pyrolysis chamber, thereby defining a low area (D) of the bottom of the separation/pyrolysis chamber at which bottom dross collects;
   a vapour removal line (23) in fluidic communication with the separation/pyrolysis chamber via the top for removing pyrolysis vapours from the separation/pyrolysis chamber;
   a top dross removal device (32) being in communication with the separation/pyrolysis chamber for removing said top dross from the surface of said separation/pyrolysis liquid; and
   a solids removal device (16, 17) extending into the low area of the separation/pyrolysis chamber for removing said bottom dross from the separation/pyrolysis chamber.

2. The system of claim 1 characterised in that said bottom of the separation/pyrolysis chamber is sloped at an angle of between 10 and 60 degrees relative to the top of the separation/pyrolysis chamber.

3. The system of claim 2 characterised in that said bottom is sloped at two or more different angles relative to the top of separation/pyrolysis chamber.

4. The system of claim 1, further comprising a cyclone for separating said pyrolysis vapours from said top dross.

5. The system of claim 1 characterised in that said separation/pyrolysis chamber is equipped with a drain located at or near said low area.

6. The system of claim 1 characterised in that the solids removal device is removable from said separation/pyrolysis chamber.

7. The system of claim 1 characterised in that said charging vessel is installed vertically, horizontally or sloped between 90 and zero degrees with respect to the separation/pyrolysis chamber.

8. The system of claim 1 characterised in that said charging vessel comprises a plurality of vessels.

9. The system of claim 1 characterised in that the separation/pyrolysis chamber includes an auger configured to remove said top dross from said separation/pyrolysis chamber.

10. The system of claim 4 characterised in that said cyclone is comprised of filters, cyclones, zig-zag sifters, or eddy flow separators installed in series or in parallel or combinations thereof.

11. The system of claim 1, further comprising one or a plurality of plungers extending through the top of said separation/pyrolysis chamber for submerging heavy materials floating on the surface of said separation/pyrolysis liquid.

12. The system of claim 1 characterised in that said separation/pyrolysis chamber is equipped with a gate configured to ensure that a contact or reaction time of the feed material with the separation/pyrolysis liquid is a sufficient length of time so that complete separation is achieved.

13. The system of claim 1, further comprising a filter and means for re-circulating said separation/pyrolysis liquid through the filter.

14. A method of recycling of waste composite feed material using the system of claim 1, the method comprising:
   obtaining a system of claim 1;
   charging said feed material from said charging vessel into said separation/pyrolysis chamber containing a separation/pyrolysis liquid and pyrolyzing said feed material to form pyrolysis vapours, top dross, and bottom dross;
   allowing the bottom dross and top dross resulting from pyrolysis of said feed material to separate within said separation/pyrolysis liquid;
   removing the pyrolysis vapours via the vapour removal line from the surface of said separation/pyrolysis liquid;
   removing said bottom dross from below the surface of said separation/pyrolysis liquid with the solids removal device; and
   removing said top dross from the surface of said separation/pyrolysis liquid with the top dross removal device.

* * * * *